United States Patent [19]

Venkatu

[11] B 3,923,563

[45] Dec. 2, 1975

[54] PROCESS FOR DOPING SILICON SEMICONDUCTORS USING AN IMPREGNATED REFRACTORY DOPANT SOURCE

[75] Inventor: Doulatabad A. Venkatu, Toledo, Ohio

[73] Assignee: Owens-Illinois, Inc., Toledo, Ohio

[22] Filed: Apr. 16, 1973

[21] Appl. No.: 351,348

[44] Published under the Trial Voluntary Protest Program on January 28, 1975 as document no. B 351,348.

[52] U.S. Cl. ................. 148/189; 148/187; 148/188

[51] Int. Cl.² ............................................. H01l 7/36

[58] Field of Search ........... 148/189, 188, 186, 187, 148/185, 175, 174

[56] References Cited

UNITED STATES PATENTS

| | | | |
|---|---|---|---|
| 3,167,461 | 1/1965 | Compton | 148/175 |
| 3,374,125 | 3/1968 | Goldsmith | 148/189 |
| 3,530,016 | 9/1970 | Joseph | 148/189 |
| 3,644,154 | 2/1972 | Hoogendoorn et al. | 148/187 |
| 3,658,606 | 4/1972 | Lyons et al. | 148/187 |

OTHER PUBLICATIONS

Ceramic Industry Magazine, Jan. 1967, p. 63.

Kingery, W.; Ceramic Fabrication Processes, New York, 1958, p. 151.

*Primary Examiner*—Walter R. Satterfield
*Attorney, Agent, or Firm*—Howard G. Bruss, Jr.; E. J. Holler

[57] ABSTRACT

Disclosed is a method for diffusion doping of silicon semiconductors by the vapor phase transport of an N-type dopant such as phosphorus oxide, antimony oxide, or arsenic oxide to the silicon semiconductor, wherein the dopant source comprises a porous, inert, rigid, dimensionally stable, refractory support impregnated with a dopant component for such N-type dopants such as aluminum metaphosphate, antimony oxide or arsenic oxide.

16 Claims, 3 Drawing Figures

PROCESS FOR DOPING SILICON SEMICONDUCTORS USING AN IMPREGNATED REFRACTORY DOPANT SOURCE

The present invention relates to diffused-junction type semiconductor devices, and especially to a new method for diffusing phosphorus antimony or arsenic into silicon semiconductors. More particularly, the present invention pertains to a precise and readily controllable method for diffusing an N-type layer in at least a portion of the surface of a silicon semiconductor for the purpose of forming a semiconductor junction therein.

Semiconductors have been known in the industry for many years, and the term semiconductor material has been considered generic to a number of materials, including silicon and silicon-germanium alloys. As used herein, the term "silicon" is intended to include such silicon and silicon-germanium alloy elements. Such elements can be circular, rectangular or triangular or any other convenient shape, although they are usually in the form of a wafer or disc.

Generally, the silicon semiconductor has an active impurity incorporated therein during manufacture or later by diffusion, which impurity affects the electrical rectification characteristics of the silicon as distinguished from other impurities which may have no appreciable effect on those characteristics. Active impurities are usually classified as donor impurities or acceptor impurities. The donor impurities include phosphorus, arsenic and antimony and the acceptor impurities include boron, gallium, aluminum and indium. In other cases, the silicon semiconductors are essentially free of such impurities and are called "intrinsic" semiconductors.

With respect to the nomenclature used in the semiconductor art, a zone of semiconductor material containing an excess of donor impurities and yielding an excess of free electrons is said to exhibit N-type conductivity. On the other hand, P-type conductivity is exhibited by a zone containing an excess of acceptor impurities resulting in a deficit of electrons or an excess of "holes." In other words, N-type conduction is characterized by electron conduction whereas a P-type conduction is one characterized by hole conduction. "Intrinsic" (sometimes called "I" type) silicon semiconductors contain neither donor or acceptor impurities in an amount sufficient to achieve either N- or P-type conduction.

When a continuous solid specimen of semiconductor material has an N-type zone adjacent to P-type zone, the boundary between them is termed a P-N or N-P junction and the specimen of semiconductor material is termed a P-N junction semiconductor device.

When a zone of P-type conductivity is adjacent a zone of greater P-type conductivity, the junction is called a $P-P^+$ junction. When a zone of N-type conductivity is adjacent a zone of greater N-type conductivity, the junction is called an N-N+ junction. Semiconductor junctions of the P-I type and N-I type also exist. The present invention encompasses the diffusion doping of phosphorus, arsenic or antimony to form N (including "N+") zones in the above types of semiconductor devices.

A commercially significant embodiment of the invention is a P-type silicon semiconductor which has formed therein a phosphorus, antimony or arsenic containing layer defining an N-type zone. The reverse side of the silicon chip or wafer retains its P-type nature and, accordingly, the product produced by this invention is a P-N junction semiconductor device. Therefore, to make a simplified P-N junction requires the diffusion of an N-type impurity into the surface layer of P-type semiconductor.

Semiconductors have application and utility for purposes such as rectifiers, transistors, photodiodes, solar batteries, semiconductor controlled rectifiers and other devices. In addition to general electronic applications, the P-N junction semiconductor is frequently used as a radiation detector or charged particle detector. For example, a charged particle such as a proton or electron releases some of its energy in passing through the P-N junction, and produces an electrical pulse which is amplified and which is proportional to the energy of the particle. In this particular usage, it is quite important to have a thin uniform P-N junction which is made possible by the present invention. Also, electromagnetic radiation such as visible light or particularly infrared radiation can be detected by its interaction with the P-N junction.

Various developments have taken place in the prior art to effect the doping of the semiconductor material by the addition of dopant impurities while the silicon crystal is being pulled from a melt or by applying alloying and diffusing methods to a growing crystal. In general, the diffusion of the doping substance into the silicon material is effected by heating a predetermined quantity of the particular dopant together with the silicon so that the dopant atoms will permeate from all sides into the semiconductor body. The maintenance of uniform spacing between dopant and semiconductor has always been a problem because non-uniform spacing results in non-uniform doping. This problem is particularly severe in those cases where the dopant changes shape or slumps at the doping temperature.

Accordingly, it is an object of the present invention to provide a solid dopant source capable of liberating phosphorus oxide, antimony oxide, or arsenic oxide vapors at elevated temperatures which does not deform or slump at such temperature and can be used repeatedly for the controlled and and uniform doping a silicon semiconductor surface.

The above and other objects and advantages of the present invention will become apparent from the following detailed description thereof taken in conjunction with the drawing wherein.

Figure 1:
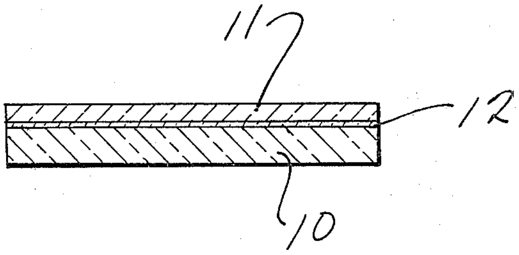
FIG. 1 is a cross-sectional view of the semiconductor body, having been processed in accordance with the method described herein.

Commonly assigned, copending application entitled "Method of Forming P-N Junction on Semiconductor," Ser. No. 305,548, filed Nov. 10, 1972 to W. E. Smith et al. (the disclosure of which is incorporated by reference) discloses a method for phosphorus doping of silicon using aluminum metaphosphate as the dopant source. In Ser. No. 305,548 the aluminum metaphosphate is present as a glass-ceramic or a body of aluminum metaphosphate. Ser. No. 305,548 does not disclose the convenience and advantages of using a porous, refractory unit support impregnated with aluminum metaphosphate as the dopant source.

The present invention overcomes the difficulties of the prior art methods by utilizing a rigid, porous, inert, dimensionally stable, refractory support impregnated with an N-type dopant component comprising aluminum metaphosphate, arsenic oxide, or antimony oxide in the proportion of at least about 20 parts of dopant component per 100 parts by weight of said support as a solid dopant source for vapor phase transport of dopant to the silicon semiconductor. According to the present invention, the solid dopant source is maintained in vapor phase communication (with or without the presence of a carrier gas) with a silicon semiconductor at a temperature and for a time sufficient to transport phosphorus oxide, antimony oxide, or arsenic oxide from the dopant source to the surface of the silicon semiconductor and permit diffusion of phosphorus, antimony or arsenic into the silicon semiconductor to the desired depth.

By impregnating the aluminum metaphosphate, antimony oxide or arsenic oxide in the porous refractory supports, the necessity of having a dense dopant body is obviated. The porous support acts as an inert host for the dopant component and, because the structural integrity of the support is maintained even when all of the dopant component decomposes, essentially all of the active ingredients are available for doping.

The invention is described in terms of the "vapor phase transport of phosphorus oxide, arsenic oxide, and antimony oxide" for lack of a clear understanding of the dopant species is vaporized from the solid dopant source. Accordingly, this term includes whatever dopant-containing species is responsible for the transport effect. Similarly, the diffusion process is discussed in terms of "phosphorus, antimony or arsenic diffusion" into the silicon semiconductor for lack of a clear understanding the dopant species actually being diffused. Accordingly, this term includes whatever dopant-containing species is responsible for the diffusion doping effect.

The dopant is deposited from the vapor phase on the surface of the silicon semiconductor and diffuses to a controlled depth with the silicon wafer. The concentration and depth of the junction is proportional to the time and temperature of the doping and diffusing process.

The composition of the support is not particularly critical as long as it is inert and dimensionally stable under doping conditions, and is sufficiently porous to contain at least about 20 parts of aluminum metaphosphate, arsenic oxide, or antimony oxide per 100 parts of support and provide a vapor phase enriched in phosphorus oxide, antimony oxide, or arsenic oxide at commercial doping temperatures in the range of about 850°C. to about 1,250°C. The support must be rigid and dimensionally stable at the doping temperatures so that deformation is not a problem. In that this doping technique employs a planar dopant source, dimensional stability of the dopant source is of the utmost importance in achieving uniformity of dopant distribution on the surface of the silicon semiconductor.

It has been found that porous refractory supports having a volume porosity in the range of about 30 percent to 80 percent and preferably in the range of 40 percent to 60 percent are quite suitable for the present purposes. The pore size of the support is critical in that they should not be so small as to restrict or block the generation of the phosphorus oxide, arsenic oxide, or antimony oxide enriched vapor phase. Average pore size diameter in the range of about 1 micron to about 10 microns is suitable for most applications.

The porous support can be formed by compacting and sintering refractory oxide powders such as stabilized zirconia powder, alumina powders, silica powders, thoria and the like.

The porous, inert, rigid, dimensionally stable refractory support can be prepared by compacting porous refractory oxide powders to form a green "compact" of the desired configuration. The green compacts are then fired for a time and at a temperature sufficient for sintering to yield the porous, inert, rigid, dimensionally stable refractory support. The sintering should not be at a temperature or for a time which would cause collapsing or coalescing of the particles to form a non-porous body. A convenient indication of the degree of sintering is a comparison of the actual density of the fired compact as compared to the theoretical density of the oxide being fired.

The refractory metal oxides can be selected from any of those oxides well-known in the art such as alumina, silica, thoria, stabilized (e.g., stabilized with MgO) zirconia, of which alumina is preferred for efficiency and economy.

The support is impregnated with the aluminum metaphosphate, arsenic oxide, or antimony oxide by means known in the art. One of the more practical means involves treatment of the support with solutions of alumina metaphosphate or arsenic oxide precursor material in suitable organic or aqueous solvents. In that aluminum metaphosphate itself is substantially insoluble in most common solvents, it is often convenient to impregnate with a solution of an aluminum metaphosphate precursor which is thermally convertible to aluminum metaphosphate in-situ in the porous support. The concentration of the solution is selected to yield a concentration of at least about 20 parts of aluminum metaphosphate per 100 parts by weight of support. Metallic antimony can be melted and infiltrated directly into the porous support.

The impregnated support is then heated to dryness, typically at temperatures 100°C. to 700°C. to atmospheric pressure during which the aluminum metaphosphate precursor, if used, is converted to aluminum metaphosphate.

In forming the support from powdered refractory oxide, the powder particle size is selected to yield a sintered compact having a porosity and pore size in the range set forth above. The techniques for compaction and sintering of the porous support are well-known in the art and form no part of the present invention. Suffice it to say that compacting pressures in the range of 1,000 p.s.i. to 10,000 p.s.i., and sintering temperatures in the range of 1,300° to 1,700°C. are commercially expedient. Additional details on compacting and sintering of refractory oxide can be obtained from the book "Oxide Ceramics" by E. Ryshkewitch, published in 1960 by Academic Press, New York, N.Y.

In accordance with one embodiment of the present invention and with reference to the attached drawings, a suitable N-type silicon substrate 10 is prepared by any of the known techniques of obtaining monocrystalline bodies of silicon. For example, a monocrystalline ingot can be formed of highly purified silicon. The ingot is cut into transverse slices and the slices are diced to form silicon wafers of the desired dimension. The surface of the substrate can be prepared by suitable cleaning and polishing. However, the polished and cleaned semiconductive silicon materials can be commercially purchased. Polishing or cleaning of the surface can be accomplished by mechanical means such as lapping or the like or by chemical means, such as etching which is well understood in the art and does not form a part of the present invention.

Furthermore, the N-type silicon wafer can be part of a complex semiconductor device and already have one or more P-N junctions arranged in any geometric pattern therein. The only important feature is that at least a part of the exposed surface of the silicon wafer exhibit P-type of conduction. Accordingly, the term P-type silicon as used herein includes such complex semiconductor devices having alternating zones of P- and N-type conduction.

For conventionally grown crystals, the surface may be chemically polished with a suitable etchant; for example, a concentrated solution of three parts hydrofluoric acid, three parts acetic acid and five parts nitric acid, by volume. Alternatively, the surface can be prepared by lapping or etching with a hot solution of water containing about 10 percent sodium hydroxide at ambient temperature and up to about 90°C. These cleaning and etching operations function for the purpose of removing contaminants from the surface and to make the surface uniform with a high degree of smoothness. These preparatory operations are well understood in the art.

Formation of P-N junctions of the present invention have been found to occur to a desirable extent on P-type silicon having a resistivity in the range of 1–50 ohm-centimeters. It is, of course, readily apparent that the precise size and nature of the wafer is not critical. For example, wafer conventionally used can be 1, 2 or 3 inches in diameter or even more. The thickness can range from 5 to 20 mils, although this can vary. Typical wafers are 8 to 10 mils thick. Likewise, the typical resistivity of suitable P-type silicon starting materials ranges from about 3 to about 15 ohm-centimeters.

An oxide layer 11 is grown on the surface of wafer 10 in accordance with this invention. The wafer is heated in the vapors of phosphorus oxide, antimony oxide, or arsenic oxide so that a film or coating is formed over at least a portion of the surface of the wafer. A mask or protective covering can be utilized so as to develop any pattern as is understood in the art. The coating or film 11 is of glassy nature and contains phosphorus, antimony, or arsenic in one form or another.

.The temperature of this operation is such that simultaneously, some phosphorus, antimony or arsenic diffuses from the film or deposit 11 into the wafer 10 forming a thin phosphorus, antimony or arsenic diffused surface layer or region 12 adjacent the coating 11. The region 12 is a barrier or boundary formed at the interface between the phosphorus, antimony, or arsenic diffused surface layer 11 and the P conductivity silicon 10. The juncture depth can vary, but in general, it is up to about 10 microns in thickness. The minimum thickness can vary and illustratively is about 0.1 micron.

Figure 2:
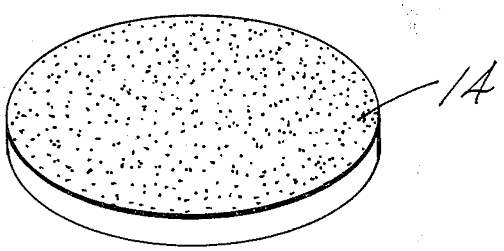
FIG. 2 is an isometric view of a solid N-type dopant source wafer as described herein.

FIG. 2 shows a disc or wafer comprising the porous support impregnated with the aluminum metaphosphate, arsenic oxide, or antimony oxide which functions as the source of dopant vapors for contact with the silicon wafers.

When positioned in a suitable furnace used for the invention, and when subjected to temperatures in the range of about 850°C. to about 1,250°C., the dopant support wafer liberates vapors, which vapors then flow through the furnace high temperature zone in the direction of contacting the silicon wafers positioned in the vicinity of the dopant wafer. Generally, the method comprises diffusing phosphorus, antimony or arsenic into a semiconductor silicon element by positioning at least one semiconductor silicon element in a furnace, positioning a solid dopant support wafer, disc or similar body in the furnace in the vicinity of, but not in physical contact with the silicon element, and then subjecting the silicon element and the dopant support to an elevated temperature in the range of 850°C. to 1,250°C. At these temperatures, the dopant support liberates phosphorus oxide, arsenic oxide, or antimony oxide vapors which vapors then pass through the furnace and contact at least a portion of the surface of the silicon element.

This process is conducted for a sufficient period of time to permit the diffusion of the phosphorus, antimony or arsenic into at least one portion of the surface of the silicon element to form a diffused region therein. After the vapors react with the hot silicon surface, the elemental phosphorus, antimony or arsenic diffuse into the silicon chip with continued heating. This usually requires about 30 minutes to about 5 hours to accomplish.

As a further aspect to this embodiment of the invention, the doping process is further controlled and enhanced by the use of free-flowing inert carrier gas such as argon, or nitrogen, where the flow is in the direction from the solid state doping source wafer 14 toward the desired doped face of the silicon chip. As used here, the expression "inert gas" means that the carrier gas does not enter into the chemical reaction between the vapors and the hot silicon surface.

Figure 3:
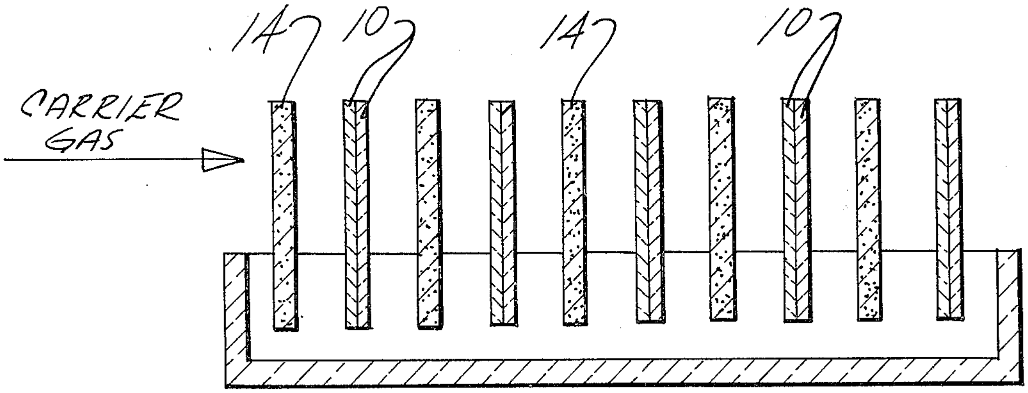
FIG. 3 is an elevation view showing a refractory container in which a plurality of inert, porous, rigid, dimensionally stable wafers impregnated with aluminum metaphosphate, arsenic oxide, or antimony oxide and a plurality of silicon wafers are arranged for doping in accordance with the invention.

This is shown in FIG. 3, wherein the carrier gas enters from the left and passes across wafer 14 where the vapors are released and contact the exposed surfaces of the silicon wafer 10. By placing two silicon wafers back-to-back, the reverse side of each of the silicon chips contacts no vapors from the process and consequently retains its original character as a P-type silicon. Following the doping process, the diffusion depth can be further increased to diffuse the junction deeper by a simple heat treatment in an inert atmosphere. This can be carried out in a separate furnace if desired.

In carrying out one aspect of the invention, the doping is accomplished by placing the dopant support wafers near and parallel to, but not touching, the silicon wafer to be doped. Generally, for best results, the distance has been determined to be about ⅛ inch. In a multi-slotted fused silica boat or other refractory vessel, container or the like, as many as 100 or more silicon chips or wafers can be doped to a uniform level by alternately spacing a dopant support wafer, and a pair of silicon wafers in back-to-back contact, with confronting faces of silicon wafers and dopant support wafers being substantially parallel. The general arrangement can be as shown in FIG. 3.

Time and temperature of doping conditions are selected to give the appropriate P-N junction depth and sheet resistivity for the desired device configuration. This is shown in the examples that follow.

Spacing of the chips in the boat and selection of ambient inert carrier gas and the flow rate are based on requirements that silicon chips facing in the direction of the ambient gas flow receive equivalent doping to those facing counter to the flow.

EXAMPLE 1

PART A

Porous alumina discs are formed by compacting high purity alumina powder having an average particle diameter of about 7-8 microns ("A-10" Brand of alumina powder sold by Alcoa) in a steel die at 6,500 p.s.i. to form "green" compacts. The green discs have a thickness of about 0.02 inches and a diameter of about 1 inch. These green discs are then fired in an air atmosphere at about 1,470°C. for 1 hour to form hard, rigid, refractory, porous, sintered alumina discs having a sintered density of about 2.2 gm/cc, porosity of about 55 percent and an average pore size estimated to be about 2–3 microns. The theoretical density of alumina is about 3.97 gm/cc.

PART B

An impregnation solution is formed as follows; 93.2 grams (0.379 mole) of aluminum sec-butoxide, i.e., $Al(OBu)_3$ are mixed with 1,000 grams of water. The mixture is stirred and heated to the boiling point in an open beaker. When all of the liberated sec-butanol has boiled off, 131.2 grams of phosphoric acid (1.14 mole) is added and boiling continued until a clear, viscous, liquid impregnation solution containing 40 percent by weight of solids is eventually obtained.

Part of this impregnation solution is tested to confirm the presence of aluminum metaphosphate precursor material therein by heating in an oven at 110°C. for 24 hours, 160°C. for 24 hours, and then slowly to 350°C. and held for 16 hours. A hard, white, lumpy solid product is obtained in quantitative yield. X-ray analysis shows that the solid product is substantially aluminum metaphosphate.

Other solutions suitable for impregnation can be prepared as disclosed in commonly assigned copending application Ser. No. 305,342 filed Nov. 10, 1972, entitled "Method of Making Aluminum Metaphosphate," the disclosure of which is incorporated by reference.

PART C

Some of the sintered alumina discs of Part A are submerged in a beaker of the impregnation solution of Part B and the beaker is placed in a vacuum dessicator at room temperature. Vacuum is applied at the level of about 29 inches of Hg to facilitate impregnation of the discs by removing air from the pores of the disc. The vacuum is then maintained overnight.

The resulting impregnated discs are heated to 500°C. for 15 hours to convert in situ the impregnated solution to aluminum metaphosphate and vaporize the water. The dried impregnated dopant discs have increased in weight by about 25 percent over the weight of the discs as submerged in the impregnation solution. X-ray diffraction analysis of the dopant discs indicates the presence of aluminum metaphosphate in the pores thereof.

PART D

Planar diffusion doping is accomplished by placing some of the dopant discs of Part C about ⅛ inch from, and in parallel confronting relationship to, the silicon wafers to be doped. The discs and silicon wafers are alternately arranged in multi-slotted, fused, silica trays by alternately spacing a dopant disc, two silicon wafers back-to-back, a dopant disc, and so on. The general assembly is as shown in FIG. 3.

The silicon wafers used in this example originally are P-type, and have a resistivity of about 13 ohm-cm.

The assembly is placed in a diffusion furnace and argon gas is passed therethrough as an inert carrier gas as shown in FIG. 3 at the rate of 600 cc/minute, while the temperature is maintained at about 1,070°C. These conditions are maintained for one hour.

At the end of this diffusion doping period, the silicon wafers cooled to room temperature and are visually observed to exhibit interference patterns on the surface thereof indicating the presence of a thin film. The surface of the doped wafers is cleaned with dilute hydrofluoric acid.

The surface of the doped silicon wafers exhibit N-type conductivity. Surface testing of the dopes wafers with a four-point conductivity probe and the surface resistivity is measured to be about 4.6 ohms/square. The dopant discs have not slumped or otherwise deformed at the end of the diffusion doping process.

Similar results are obtained when powdered stabilized zirconia having an average particle size diameter of about 10 microns, or similarly sized silica powder are used in place of the alumina powder in Part A of this Example.

EXAMPLE 2

An impregnation solution is formed as in Part B of Example 1 wherein the boiling is continued until a clear, viscous liquid impregnation solution containing 40 percent by weight of solids is obtained. A porous sintered alumina disc having a porosity of about 58 percent is prepared by the procedures of Part A of Example 1.

Several of the sintered, porous alumina discs are placed in the impregnation solution and the solution is boiled at atmospheric pressure until the solution volume is reduced approximately in half. This took about 1 hour to accomplish.

The alumina disc so impregnated is removed and heated at 500°C. for 15 hours to convert, in situ, the impregnated solution to aluminum metaphosphate and vaporize the water. The resulting impregnated dopant discs have increased in weight by about 42 percent over the weight of the discs as submerged in the impregnation solution. X-ray diffraction analysis of the dopant discs indicates the presence of aluminum metaphosphate in the pores thereof.

Planar diffusion doping is accomplished as in Part D of Example 1. The resulting doped silicon wafer exhibits N-type conductivity and has a surface resistivity of about 6.4 ohms/square when measured by a four-point probe. The dopant discs have not slumped or deformed in any way.

EXAMPLE 3

PART A

A thin layer of powdered antimony metal is placed on several of the sintered alumina discs prepared in Part A of Example 1. Each alumina disc initially weighs about 1.7 grams.

The alumina discs with the antimony layer thereon are placed in a tightly covered vessel (to retard antimony loss) and heated to about 816°C. for about 5 hours. The discs are then cooled to room temperature and weighed to determine the gain in weight. The weight gain varies from about 1 gram to about 3 grams for the several alumina discs treated. X-ray diffraction of the antimony-containing alumina discs indicate that $Sb_2O_4$, $AlSbO_4$, and B-$Sb_2O_4$ are present as crystalline phases in the pores of the alumina discs.

PART B

Planar diffusion doping is accomplished by placing some of the dopant discs of Part A about ⅛ inch from, and in parallel, confronting relationship to, the silicon wafers to be doped as described in Part D of Example 1.

The silicon wafers used in this example originally are P-type and have a surface resistivity of about 47 ohms/-square.

The assembly is placed in a diffusion furnace and argon gas is passed therethrough as an inert carrier gas as shown in FIG. 3 at the rate of about 600 cc/min., while the temperature is maintained at about 1,027°C. These conditions are maintained for about 70 minutes.

At the end of this diffusion doping period, the silicon wafers cool to room temperature and are visually observed to exhibit interference patterns on the surface thereof, indicating the presence of a thin film. The surface of the doped wafers is cleaned with dilute hydrofluoric acid.

The surface of the doped silicon wafers exhibit N-type conductivity and have a surface resistance of about 44 ohms/square.

PART C

The doped silicon wafers of Part B are then returned to the diffusion furnace using the same dopant discs and assembly, and diffusion doping is again carried out for an additional 105 minutes under the same temperature and carrier gas conditions.

After cooling and cleaning with hydrofluoric acid, the resistance of the redoped silicon wafers is about 42 ohms/square of N-type conductivity. The dopant discs are weighed and exhibit a weight loss equivalent to the rate of 0.006 grams per minute.

PART D

The diffusion doping procedures of Part B of this example are repeated except that the silicon wafers being doped have an initial P-type surface resistance of about 36 ohms/square, the doping temperature is 1,220°C. and the doping time is 45 minutes.

At the end of this doping period, the wafers are cooled and cleaned with hydrofluoric acid as described above and are observed to exhibit N-type conductivity with a surface resistance of about 12 ohms/square. The dopant discs are weighed and exhibit a weight loss equivalent to the rate of 0.03 grams per minute. The dopant discs have not slumped or otherwise deformed at the end of the diffusion doping process.

EXAMPLE 4

PART A

An impregnation solution is formed by dissolving $As_2O_5$ in water in the proportion of about 1.5 grams $As_2O_5$ per gram of water.

Some of the sintered alumina discs of Part A of Example 1, weighing about 1.7 grams each, are submerged in a beaker of the impregnation solution and the beaker is placed in a vacuum dessicator at room temperature. Vacuum is applied at the nominal level of about 29 inches of Hg to facilitate impregnation of the discs by removing air from the pores of the discs. The impregnation solution bubbles and froths and the vacuum is maintained until the bubbling has subsided. This requires about 3 hours.

The discs are then removed from the impregnation solution and dried at 150°C. The weight gain per disc is about 0.5 grams. X-ray diffraction analysis indicates the presence of $As_2O_5$ as a crystalline phase in the pores of the alumina discs.

PART B

Planar diffusion doping is accomplished by placing some of the dopant discs of Part A about ⅛ inch from, and in parallel confronting relationship to, the silicon wafers to be doped as described in Part D of Example 1.

The silicon wafers used in this example originally are P-type and have a surface resistance of about 43 ohms/-square.

The assembly is placed in a diffusion furnace and argon gas is passed through as an inert carrier gas as shown in FIG. 3 at the rate of 600 cc/min. while the temperature is maintained at 1,027°C. These conditions are maintained for 70 minutes.

After cooling and cleaning the doped silicon wafers with hydrofluoric acid, the silicon wafers exhibit N-type conductivity and have a surface resistance of about 41 ohms/square.

PART C

The doped silicon wafers from Part B are then returned to the diffusion furnace using the same dopant discs and assembly, and diffusion doping is carried out for an additional 75 minutes.

At the end of this period, the silicon wafers are cooled and cleaned with hydrofluoric acid and exhibit a surface resistivity of about 39 ohms/square. The dopant discs are weighed and exhibit a weight loss equivalent to the rate of about 0.005 grams per minute. The dopant discs have not slumped or otherwise deformed at the end of the diffusion doping process.

PART D

The procedures of Part B of this Example are repeated using silicon wafers having P-type conductivity and an initial surface resistance of about 50 ohms/-square. The doping temperature is 1,135°C. and the doping time is 50 minutes.

After cooling and cleaning the doped silicon wafers with dilute hydrofluoric acid, the silicon wafers exhibit N-type conductivity and have a surface resistance of about 11 ohms/square.

Having thus described the invention, what is claimed is:

1. In the process for doping a silicon semiconductor wherein a silicon semiconductor and a solid dopant source for vapor phase transport of an N-type dopant are maintained in vapor phase communication at a temperature and for a time sufficient to form a zone of N-type conductivity in said semiconductor, the improvement wherein said solid dopant source comprises a porous, inert, rigid, dimensionally stable, refractory support having a volume porosity in the range of about 30 percent to about 80 percent and an average pore size diameter of about 1 micron to about 10 microns, said support having been formed by compacting and sintering a refractory oxide powder, said support being impregnated with a dopant component comprising aluminum metaphosphate, arsenic oxide, or antimony oxide, said dopant component being present in the proportion of at least about 20 parts by weight of said support.

2. The process of claim 1 wherein said powder is alumina.

3. The process of claim 1 wherein said dopant component is aluminum metaphosphate.

4. The process of claim 1 wherein said dopant component is arsenic oxide.

5. The process of claim 1 wherein said dopant component is antimony oxide.

6. The process of claim 1 wherein said silicon semiconductor is a P-type semiconductor.

7. The process of claim 1 wherein a carrier gas is used for vapor phase transport of said dopant.

8. The process of claim 1 wherein said temperature is in the range of about 850°C. to about 1,250°C.

9. The method of claim 1 wherein said time varies from about 30 minutes to about 5 hours.

10. The process for diffusing phosphorus into a silicon semiconductor comprising the steps of:

positioning at least one silicon semiconductor in a heating chamber;

positioning a solid dopant source in said heating chamber in vapor phase communication with, but not in physical contact with, said silicon semiconductor, said dopant source comprising a porous, inert, rigid, dimensionally stable refractory support having a volume porosity in the range of about 30 to about 80 percent and an average pore size diameter of about 1 micron to about 10 microns, said support having been formed by compacting and sintering a refractory oxide powder, said support being impregnated with aluminum metaphosphate, said aluminum metaphosphate being present in the proportion of at least about 20 parts by weight per 100 parts of said support;

subjecting said silicon semiconductor and said dopant source to a temperature in the range of 850°C. to about 1,250°C. for a time sufficient to liberate phosphorus oxide vapors from said dopant source;

contacting said phosphorus oxide vapors with at least a portion of the surface of said semiconductor for a period of time sufficient to permit diffusion of phosphorus into the surface of said silicon semiconductor to form a phosphorus-enriched zone therein.

11. The process of claim 10 wherein said silicon semiconductor is a P-type semiconductor.

12. The process of claim 11 wherein said silicon semiconductor and said dopant source are in the form of wafers.

13. The process of claim 10 wherein a plurality of dopant source wafers and a plurality of silicon semiconductor wafers are alternately positioned with planar wafer surfaces being substantially parallel and in spaced confronting relationship.

14. The process of claim 10 wherein a pair of said silicon semiconductor wafers in back-to-back contact are alternately positioned in said substantially parallel, spaced, confronting relationship with planar surfaces of said dopant source wafers.

15. In the process of forming a P-N junction in a P-type silicon semiconductor and a solid dopant source for vapor phase transport of phosphorus oxide are maintained in vapor phase communication at a temperature and for a time sufficient to form said P-N junction, the improvement wherein said solid dopant source comprises a porous, inert, rigid, dimensionally stable, refractory support having a volume porosity in the range of about 30 to about 80 percent and an average pore size diameter of about 1 micron to about 10 microns, said support having been formed by compacting and sintering a refractory oxide powder, said support being impregnated with aluminum metaphosphate, said aluminum metaphosphate being present in the proportion of at least 20 parts of weight per hundred parts of support, said support being rigid and dimensionally stable during the period of forming said P-N junction.

16. The process of claim 1 wherein said support has a volume porosity in the range of about 40 to about 60 percent.

* * * * *